US011587911B2

(12) United States Patent
Val

(10) Patent No.: US 11,587,911 B2
(45) Date of Patent: Feb. 21, 2023

(54) PROCESS FOR PRODUCING A HIGH-FREQUENCY-COMPATIBLE ELECTRONIC MODULE

(71) Applicant: 3D PLUS, Buc (FR)

(72) Inventor: Christian Val, St Remy les Chevreuse (FR)

(73) Assignee: 3D PLUS, Buc (FR)

(*) Notice: Subject to any disclaimer, the term of this patent is extended or adjusted under 35 U.S.C. 154(b) by 0 days.

(21) Appl. No.: 17/240,789

(22) Filed: Apr. 26, 2021

(65) Prior Publication Data

US 2021/0335755 A1 Oct. 28, 2021

(30) Foreign Application Priority Data

Apr. 27, 2020 (FR) ...................................... 2004163

(51) Int. Cl.
*H01L 25/065* (2006.01)
*H01L 23/48* (2006.01)
*H01L 25/00* (2006.01)

(52) U.S. Cl.
CPC ........ *H01L 25/0657* (2013.01); *H01L 23/481* (2013.01); *H01L 25/50* (2013.01); *H01L 2225/06541* (2013.01)

(58) Field of Classification Search
CPC .................. H01L 25/0657; H01L 23/481
See application file for complete search history.

(56) References Cited

U.S. PATENT DOCUMENTS

| 2003/0071335 | A1 | 4/2003 | Jeung et al. |
| 2008/0272504 | A1 | 11/2008 | Do et al. |
| 2008/0308921 | A1 | 12/2008 | Kim et al. |
| 2012/0168942 | A1 | 7/2012 | Gan et al. |
| 2021/0066276 | A1* | 3/2021 | Kim ........................ H01L 25/18 |
| 2021/0296285 | A1* | 9/2021 | Sharangpani ..... H01L 21/76804 |
| 2022/0045045 | A1* | 2/2022 | Lee ................... H01L 27/11529 |
| 2022/0115294 | A1* | 4/2022 | Kim ........................ H01L 25/105 |
| 2022/0157838 | A1* | 5/2022 | Ahn ................... H01L 27/11573 |

\* cited by examiner

*Primary Examiner* — Thao P Le
(74) *Attorney, Agent, or Firm* — BakerHostetler

(57) ABSTRACT

The field of the invention is that of producing 3D electronic modules, compatible with components operating beyond 1 GHz. The invention relates to a 3D electronic module featuring an interconnection between a horizontal conductor and a vertical conductor to which it is connected exhibits, in a vertical plane, a non-zero curvature. It also relates to the associated production process.

7 Claims, 4 Drawing Sheets

PROCESS FOR PRODUCING A HIGH-FREQUENCY-COMPATIBLE ELECTRONIC MODULE

CROSS-REFERENCE TO RELATED APPLICATIONS

This application claims priority to foreign French patent application No. FR 2004163, filed on Apr. 27, 2020, the disclosure of which is incorporated by reference in its entirety.

FIELD OF THE INVENTION

The field of the present invention is that of producing 3D electronic modules, compatible with components operating beyond 1 GHz. The invention relates to a 3D electronic module. It also relates to the process for producing same.

BACKGROUND

In a 3D electronic module, there are multiple levels of components stacked on top of one another. A 3D module or printed circuit board (PCB) comprises multiple horizontal levels comprising electrical conductors and components.

3D interconnections may be categorized according to three groups:
a. the stacking of bare chips or of packages with interconnection by means of a metal bus;
b. the stacking of bare chips interconnected by holes through the silicon, also called TSVs for through-silicon vias;
c. the stacking of bare chips interconnected by connecting wires, one level after the next.

For the first group, in order to interconnect chips that are stacked on top of one another, the vertical faces of the stack, which are metallized, are used to form the electrical connections between chips. As a result, the current technology is based on a "T"-shaped interconnection. Each stacked level contains conductors etched into a PCB which are connected vertically by a metal bus. In other words, the interconnections between the 2D (plane of a level) and 3D (stacking of the various levels) levels are made perpendicularly, i.e. at 90°.

For the second group, generally, these electronic modules are provided with holes pierced vertically, i.e. in the direction of the thickness of the module. The metallized holes, often called vias, pass through these levels and thus allow these conductors to be connected to one another vertically through contact between the metallized holes and the sections of these conductors level with the holes. Hereinafter, "hole" refers to a blind hole (a hole that does not pass all the way through) or a through-hole. Of course, an electronic module may comprise blind holes and through-holes. In this case too, the conductors located on the various stacked planes orthogonally intercept the holes.

For the third group, the superposed layers of connecting wires lead to substantial variations in impedance and inductive interference. They cannot be used beyond 1 GHz.

For the first and second groups, the 3D interconnection is orthogonal as mentioned, although TSVs are much smaller in size than an interconnection using a metal bus.

For components operating beyond 1 GHz, the orthogonal interconnection, or "T"-shaped interconnection, leads to reflections that negatively affect signal integrity. For a 3D electronic module in the radiofrequency domain, since the connections are vertical on the faces of the stack, the "T"-shaped interconnections between electrical conductors (for example conductors from chips and vertical conductors) are arranged at right angles. Electrons are reflected at the site of the connection, which interferes with the electrical connection and weakens it.

Consequently, there is still a need for a method for interconnecting stacked chips that allows the integrity of signals to be ensured at radiofrequencies.

SUMMARY OF THE INVENTION

The invention aims to overcome all or some of the problems mentioned above by providing an interconnection by virtue of which the signal arriving over a conductor of the PCB, a deposited redistribution layer, called an RDL, or a via follows a curved trajectory to reach the metal bus.

To that end, one subject of the invention is a 3D electronic module comprising, in a direction referred to as the vertical direction, a stack of at least two electronic packages, the module being able to be joined to an interconnect circuit, each of the at least two electronic packages comprising:
a. components provided with interconnect pads that are oriented towards an upper surface of the components, said components being at least partially surrounded by epoxy resin, the interconnect pads of each component being connected by redistribution layers to vertical conductors which are in turn intended to be electrically connected to the interconnect circuit of the module, and
b. horizontal conductors, a horizontal conductor and the vertical conductor to which it is connected forming an electrical conductor between an interconnect pad of a component and the interconnect circuit, the 3D electronic module being characterized in that the interconnection between a horizontal conductor and the vertical conductor to which it is connected exhibits, in a vertical plane, a non-zero curvature.

In one embodiment of the 3D electronic module according to the invention, the vertical conductors are buses.

In another embodiment of the 3D electronic module according to the invention, the vertical conductors are vias.

Advantageously, the curvature of the interconnection between the horizontal conductor and the vertical conductor to which it is connected forms a tangent to the vertical conductor.

The invention also relates to a process for producing a 3D electronic module able to be joined to an interconnect circuit, characterized in that it comprises the following steps:
a. adding components provided with interconnect pads to a first surface of a bonding skin, a lower surface of the components being in contact with the bonding skin and the interconnect pads being oriented towards an upper surface of the components;
b. depositing a first epoxy resin in the space between the components and polymerizing the resin in order to obtain a panel;
c. making a groove with a first depth in the space filled with the first epoxy resin, said groove widening towards the upper surface of the panel and laterally exhibiting a curvature;
d. metallizing the grooved panel;
e. laser-etching the metallized grooved panel so as to isolate horizontal conductors;
f. depositing a second epoxy resin in the space formed by the groove;
g. producing one or more photoetched redistribution layers on the upper surface of the panel;

h. removing the bonding skin in order to obtain a plate;

i. depositing a third epoxy resin on the upper surface of the plate;

j. stacking a second plate on the plate covered with the third epoxy resin;

k. making a through-groove in the space filled with the second epoxy resin;

l. metallizing the through-groove in order to obtain a vertical conductor.

According to one embodiment of the process according to the invention, the first depth is less than the thickness of the space filled with the first epoxy resin.

According to another embodiment of the process according to the invention, the first depth is equal to the thickness of the space filled with the first epoxy resin.

BRIEF DESCRIPTION OF THE DRAWINGS

The invention will be better understood and further advantages will become apparent from reading the detailed description of one embodiment provided by way of example, which description is illustrated by the attached drawing, in which:

FIG. 7 schematically shows a sectional view of a 3D electronic module according to the invention;

DETAILED DESCRIPTION

From one figure to another, the same elements bear the same references.

In the rest of the description, the expressions "high" and "low" are used with reference to the orientation of the described figures. Insofar as the 3D electronic module may be positioned according to other orientations, the directional terminology is indicated by way of illustration and is not limiting.

Figure 1:
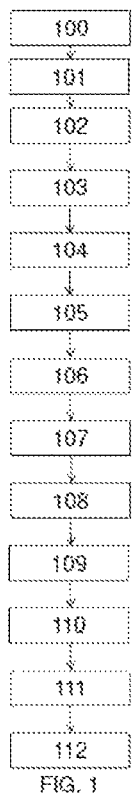
FIG. 1 schematically illustrates the steps of the process for producing the 3D electronic module according to the invention.

FIG. 1 schematically illustrates the steps of the process for producing the 3D electronic module according to the invention. The process for producing a 3D electronic module according to the invention comprises steps 100 to 112 carried out in succession as explained in detail below.

FIGS. 2 to 7 schematically show the successive steps of the process for producing the 3D electronic module according to the invention.

Figure 2:
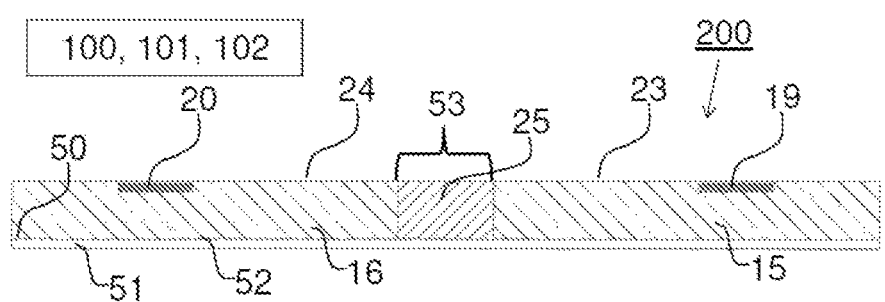
FIGS. 2 to 7 schematically show the successive steps of the process for producing the 3D electronic module according to the invention.
Figure 3:
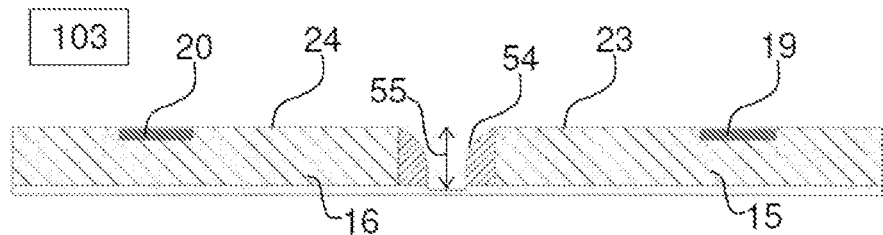

As shown in FIG. 2, the process for producing a 3D electronic module comprises a step 100 of adding components 15, 16 provided with interconnect pads 19, 20 to a first surface 50 of a bonding skin 51. During this adding step, a lower surface 52 of the components 15, 16 is in contact with the bonding skin 51 and the interconnect pads 19, 20 are oriented towards an upper surface 23, 24 of the components 15, 16.

The production process according to the invention next comprises a step 101 of depositing a first epoxy resin 25 in the space 53 between the components 15, 16 and a step 102 of polymerizing the resin 25 in order to obtain a panel 200.

The production process according to the invention comprises a step 103 of making a groove 54 with a first depth 55 in the space 53 filled with the first epoxy resin 25. More particularly, the groove 54 widens towards the upper surface of the panel 200 and laterally exhibits a curvature. This groove 54 may be made by means of a saw the shape of which is complementary to the groove 54 shown in FIG. 3. The groove 54 may also be made by means of any other tool allowing a portion of the resin 25 to be removed such that the resulting groove has lateral walls exhibiting a curvature. Advantageously, the curvature is located in the region close to the upper surfaces 23, 24. This region will be, once the production process has been carried out, the interconnect region between a horizontal conductor and its vertical conductor to which the horizontal conductor is connected. As a result, the interconnection between a horizontal conductor and the vertical conductor exhibits, in a vertical plane, a non-zero curvature. The advantage of this non-orthogonal interconnection for a 3D electronic module with vertical connections on the faces of the stack in the radiofrequency domain is thus that reflection of electrons at the site of the connection, which interferes with the electrical connection and weakens it, is prevented. By virtue of the invention, the signal arriving over the horizontal conductor will follow a curved trajectory to reach the vertical conductor, as explained below. The non-zero curvature according to the invention is a portion of a circular arc that exhibits a regular curvature and does not result from surface overlap.

Figure 4:
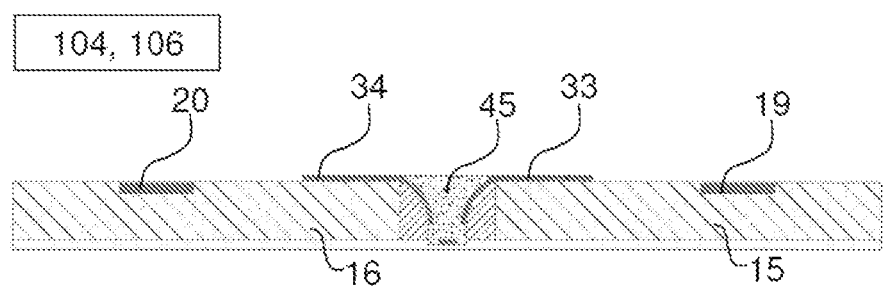
Figure 5:
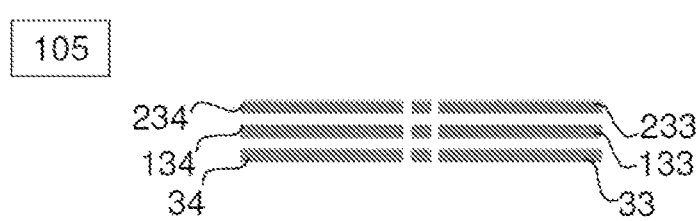

FIG. 4 shows step 104 of metallizing the grooved panel 200 obtained in step 103. The process next comprises a step 105 of laser-etching the metallized grooved panel 200 so as to isolate horizontal conductors 33, 34. This also applies to the horizontal conductors 31, 32 (not shown in FIG. 4 but visible in FIG. 7). This step 105 is shown in FIG. 5 by a view from above of the horizontal conductors isolated from one another after etching step 105.

FIG. 4 also shows step 106 of depositing a second epoxy resin 45 in the space formed by the groove 54.

Figure 6:
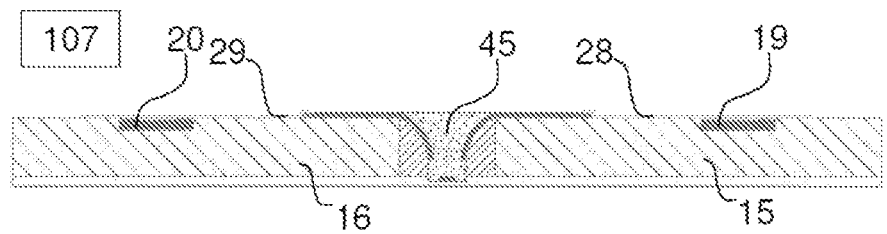

FIG. 6 illustrates step 107 of producing one or more photoetched redistribution layers 28, 29 on the upper surface of the panel. This step allows one or more horizontal interconnect levels to be produced.

Figure 7:
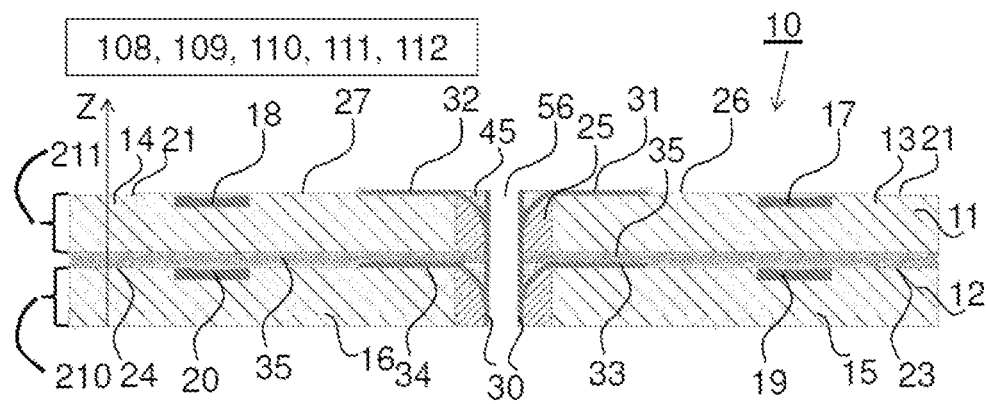

FIG. 7 shows the last steps of the production process that is a subject of the invention. The process comprises a step 108 of removing the bonding skin 51 in order to obtain a plate 210, and then a step 109 of depositing a third epoxy resin 35 on the upper surface of the plate 210. Next, there is a step 110 of stacking a second plate 211 on the plate 210, the plate 210 being covered with the third epoxy resin 35 in order to allow bonding of the plate 211 to the plate 210.

Lastly, the process for producing the 3D electronic module 10 comprises a step 111 of making a through-groove 56 in the space filled with the second epoxy resin 45 and a step 112 of metallizing the through-groove 56 in order to obtain a vertical conductor 30.

In some variants of the production process according to the invention, in the step of making the groove 54, the first depth 55 may be less than the thickness of the space 53 filled with the first epoxy resin 25. In this case, a "blind" hole is obtained. Alternatively, the first depth 55 may be equal to the thickness of the space 53 filled with the first epoxy resin 25. Then it is a through-hole. Making such a hole, whether a blind or through-hole, makes it possible to obtain an inter-level interconnection in the case of stacking components. By applying the principle of the invention, the interconnection is again curved in this case. In each of the levels before stacking, a suitable bore or a piercing is made using a forming tool, and allows the desired curved shape to be obtained.

FIG. 7 thus shows a sectional view of a 3D electronic module 10 according to the invention. The 3D electronic module 10 comprises, in a direction referred to as the vertical direction Z, a stack of at least two electronic packages 11, 12. The module is able to be joined to an interconnect circuit (not shown). Each of the at least two electronic packages 11, 12 comprises:

a. components 13, 14, 15, 16 provided with interconnect pads 17, 18, 19, 20 that are oriented towards an upper surface 21, 22, 23, 24 of the components 13, 14, 15, 16, said components 13, 14, 15, 16 being at least partially surrounded by epoxy resin 25, 35, 45, the interconnect pads 17, 18, 19, 20 of each component 13, 14, 15, 16 being connected by redistribution layers 26, 27, 28, 29 to vertical conductors 30 which are in turn intended to be electrically connected to the interconnect circuit of the module, and b. horizontal conductors 31, 32, 33, 34, a horizontal conductor 31, 32, 33, 34 and the vertical conductor 30 to which it is connected forming an electrical conductor between an interconnect pad 17, 18, 19, 20 of a component 13, 14, 15, 16 and the interconnect circuit, According to the invention, the interconnection between a horizontal conductor 31, 32, 33, 34 and the vertical conductor 30 to which it is connected exhibits, in a vertical plane, a non-zero curvature. The curved interconnection between the horizontal conductors and the metal bus 30 allows the signal arriving over the horizontal conductor to follow a curved trajectory to reach the vertical conductor. As shown in FIG. 7, the curvature of the interconnection between the horizontal conductor 31, 32, 33, 34 and the vertical conductor 30 to which it is connected forms a tangent to the vertical conductor 30. As a result, the invention ensures the interconnection of stacked chips while ensuring the integrity of signals at radiofrequencies.

Generally presented as vertical conductors, the vertical conductors 30 may be buses or vias. The invention therefore corresponds to an interconnection between vertical and horizontal conductors with a curvature.

Figure 8:
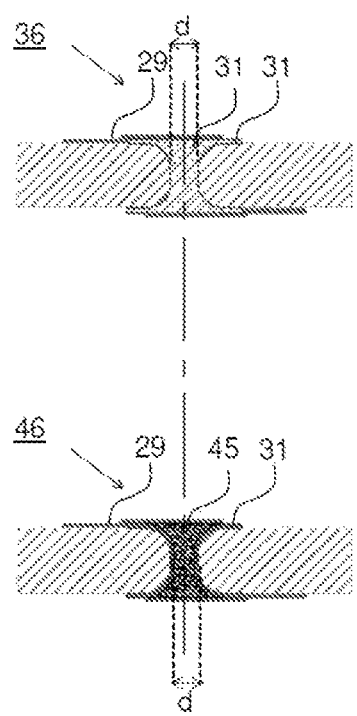
FIG. 8 shows one embodiment in which the principle of the invention is applied to a via.

FIG. 8 shows one embodiment in which the principle of the invention is applied to a via 36, 46. A via is a through-via, the invention applying similarly to a vertical conductor or to a via.

At the top of FIG. 8, the via 36 has a diameter smaller than 200 micrometres. Reference 31 of the via 36 corresponds to the copper, both as the horizontal conductor and to fill the small-diameter via. The photoetched layer 29 comes into contact with the via in the conventional manner.

At the bottom of FIG. 8, the via 46 has a diameter larger than 200 micrometres. Reference 31 of the via 36 corresponds to the copper, forming both the horizontal conductor and the vertical conductive portion. The hole itself is filled with resin 45. The photoetched layer 29 comes into contact with the via in the conventional manner.

A printed circuit board is made up of layers that are stacked on top of one another. To obtain a via according to the invention, it is necessary to pierce the circuit from one side with a forming bit, as explained above, and then to pierce the circuit from the other side with the forming bit in order to form the through-hole 36, 46. In FIG. 8, the vias 36, 46 have undergone the step of metallization and, as applicable, of depositing the epoxy resin 45. Thus, the via exhibits a curvature in its interconnection with the horizontal conductors.

Figure 9:
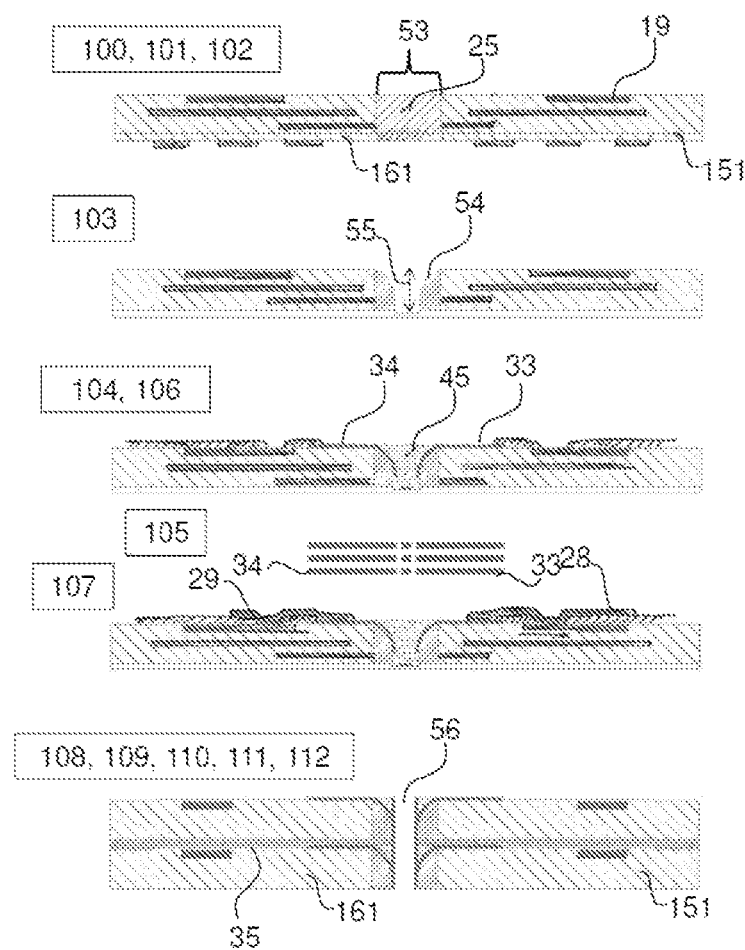
FIG. 9 schematically shows one variant of the process for producing the 3D electronic module according to the invention.

FIG. 9 schematically shows one variant of the process for producing the 3D electronic module according to the invention with printed circuit boards 151, 161 (PCBs). In this variant, each PCB 151, 161 is considered to be a component and the same process as described above applies.

Lastly, it may be noted that the principle of the invention according to which the interconnection between horizontal conductors and vertical conductors exhibits a certain curvature also applies to TSVs (through-silicon vias). The process for obtaining such a TSV with a non-orthogonal interconnection is carried out in a manner similar to that for a via as described above with the vias 36, 46.

The invention claimed is:

1. A 3D electronic module comprising, in a direction referred to as the vertical direction (Z), a stack of at least two electronic packages, the module being able to be joined to an interconnect circuit, each of the at least two electronic packages comprising:

a. components provided with interconnect pads that are oriented towards an upper surface of the components, said components being at least partially surrounded by epoxy resin, the interconnect pads of each component being connected by redistribution layers to vertical conductors which are in turn intended to be electrically connected to the interconnect circuit of the module, and b. horizontal conductors, a horizontal conductor and the vertical conductor to which it is connected forming an electrical conductor between an interconnect pad of a component and the interconnect circuit, c. an interconnecting structure conductor between a horizontal conductor and the vertical conductor;

the interconnecting structure having a non-zero curvature covered with epoxy resin.

2. The 3D electronic module according to claim 1, wherein the vertical conductors are buses.

3. The 3D electronic module according to claim 1, wherein the vertical conductors are vias.

4. The 3D electronic module according to claim 1, wherein the curvature of the interconnection between the horizontal conductor and the vertical conductor to which it is connected forms a tangent to the vertical conductor.

5. A process for producing at least two 3D electronic modules, each 3D electronic module comprising one stack of at least two electronic packages and being able to be joined to an interconnect circuit, each electronic package comprising components, the process comprising the following steps:

a. adding (step 100) the components provided with interconnect pads to a first surface of a bonding skin, a lower surface of the components being in contact with the bonding skin and the interconnect pads being oriented towards an upper surface of the components;

b. depositing (step 101) a first epoxy resin in the space between the components and polymerizing (step 102) the resin in order to obtain a panel;

c. making (step 103) a groove with a first depth in the space filled with the first epoxy resin, said groove widening towards the upper surface of the panel and laterally exhibiting a curvature;

d. metallizing (step 104) the grooved panel in order to obtain at least a horizontal conductor and at least an interconnecting structure connected to a horizontal conductor, and having a non-zero curvature;

e. laser-etching (step 105) the metallized grooved panel so as to isolate horizontal conductors;

f. depositing (step 106) a second epoxy resin in the space formed by the groove;

g. producing (step 107) one or more photoetched redistribution layers on the upper surface of the panel;
h. removing the bonding skin in order to obtain a plate;
i. depositing (step 109) a third epoxy resin on the upper surface of the plate;
j. stacking (step 110) a second plate on the plate covered with the third epoxy resin;
k. making (step 111) a through-groove in the space filled with the second epoxy resin in order to obtain two 3D electronic modules, each comprising one stack of at least two electronic packages;
l. Metallizing (step 112) the through-groove in order to obtain, for each 3D electronic module, a vertical conductor connected to a horizontal conductor via said interconnecting structure having a non-zero curvature.

6. The process for producing an electronic module according to claim 5, wherein the first depth is less than the thickness of the space filled with the first epoxy resin.

7. The process for producing an electronic module according to claim 5, wherein the first depth is equal to the thickness of the space filled with the first epoxy resin.

\* \* \* \* \*